(12) United States Patent
Patel et al.

(10) Patent No.: US 6,436,187 B1
(45) Date of Patent: Aug. 20, 2002

(54) PROCESS FOR FABRICATING ARTICLE HAVING SUBSTANTIAL THREE-DIMENSIONAL ORDER

(75) Inventors: Sanjay Patel, New Providence; Robert Waverly Zehner, Union City, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/388,166

(22) Filed: Sep. 1, 1999

(51) Int. Cl.[7] .............................................. C30B 25/02
(52) U.S. Cl. .......................................... 117/68
(58) Field of Search ........................................... 117/68

(56) References Cited

U.S. PATENT DOCUMENTS

| | | |
|---|---|---|
| 5,172,267 A | 12/1992 | Yablonovitch |
| 5,240,488 A | 8/1993 | Chandross et al. |
| 5,600,483 A | 2/1997 | Fan et al. |

OTHER PUBLICATIONS

Russell, P.S.J., "Photonic Band Gaps," *Physics World*, 37 (1992).

Holland, B.T. et al., "Synthesis of Macroporous Minerals with Highly Ordered Three–Dimensional Arrays of Spheroidal Voids," *Science*, vol. 281, 538 (1998).

Judith,.E.G. et al., "Preparation of Photonic Crystals Made of Air Spheres in Titania", *Science*, vol. 281, 802, (1998).

Zakhidov, A.A., et al., "Carbon Structures with Three–Dimensional Periodicity at Optical Wavelengths," *Science*, vol. 282, 897 (1998).

Van Blaaderen, A. et al., "Template–directed colloidal crystallization," *Nature*, vol. 385, 321 (1997).

Joannopoulos et al., *Photonic Crystals*, Princeton University Press (1995).

*Primary Examiner*—Felisa Hiteshew
(74) *Attorney, Agent, or Firm*—Scott J. Rittman

(57) ABSTRACT

The invention reflects a recognition that prior art templates for colloidal crystal formation do not provide the expected level of three-dimensional periodicity, and further provides a process using an improved template, by which extremely high-quality colloidal crystals are able to be formed. Specifically, the colloidal template of the invention is designed such that the colloidal particles are induced to settle into the desired locations, unlike in prior art templates, thereby settling in an ordered manner.

14 Claims, 2 Drawing Sheets

PROCESS FOR FABRICATING ARTICLE HAVING SUBSTANTIAL THREE-DIMENSIONAL ORDER

BACKGROUND OF THE INVENTION

1. Field of the Invention

The invention relates to colloidal crystals, in particular formation of colloidal crystals useful as templates, e.g., for photonic band gap materials.

2. Discussion of the Related Art

Recently, there has been increasing interest in periodic dielectric structures, also referred to as photonic crystals (PC), in particular, photonic crystals exhibiting gaps in photonic band structures (referred to as photonic band gap (PBG) materials), for numerous photonic applications. See, e.g., P. S. J. Russell, "Photonic Band Gaps," *Physics World*, 37, August 1992; I. Amato, "Designing Crystals That Say No to Photons," *Science*, Vol. 255, 1512 (1993); and U.S. Pat. Nos. 5,600,483 and 5,172,267, the disclosures of which are hereby incorporated by reference. PBG materials exhibit a photonic band gap, analogous to a semiconductor's electronic band gap, that suppresses propagation of certain frequencies of light, thereby offering, for example, photon localization or inhibition of spontaneous emission. A PC is generally formed by providing a high refractive index dielectric material with a three-dimensional lattice of cavities or voids having low refractive index. Photons entering the material concentrate either at the high-index regions or the low-index regions, depending on the particular energy of the photon, and the photonic band gap exists for photons of a particular energy between the two regions. Photons having energy within the PBG cannot propagate through the material, and their wave function thereby decays upon entering the material. The photonic band structure, therefore, depends on the precision of the physical structure and on its refractive index, and some difficulty has arisen in fabricating such materials. Specifically, it has been difficult to organize a three-dimensional lattice with micron-scale periodicities, particularly with high refractive index materials. (Micron-scale periodicities, as used herein, indicate that a structure contains repeating units, the repetition occurring at a distance falling within the range 0.1 $\mu$m to 100 $\mu$m.)

In one approach, reflected in the above-cited U.S. Patents, solid materials are provided with numerous holes by mechanical techniques, e.g., drilling, or by conventional silicon lithographic techniques. This approach has provided useful results, but is limited by the ability of current processing technology to provide the necessary structure. Drilling, for example, is not capable of providing periodicity on a micron scale. And conventional silicon lithography, for example, generally does not provide an article having sufficient dimensionality in all three dimensions.

In another approach, ordered colloidal suspensions or sediments of relative low refractive index particles such as silica or polystyrene, referred to as colloidal crystals, are used as templates for infiltration or deposition of high refractive index materials in a desired structure, and the particles are then etched away or burned out to provide the voids. Such crystals are typically formed by allowing slow sedimentation of substantially uniformly-sized particles in a liquid, such that the particles arrange themselves in a periodic manner. See, e.g., B. T. Holland et al., "Synthesis of Macroporous Minerals with Highly Ordered Three-Dimensional Arrays of Spheroidal Voids," *Science*, Vol. 281, 538 (July 1998); E. G. Judith et al., "Preparation of Photonic Crystals Made of Air Spheres in Titania," *Science*, Vol. 281, 802 (July 1998); and A. A. Zakhidov et al., "Carbon Structures with Three-Dimensional Periodicity at Optical Wavelengths," *Science*, Vol. 282, 897 (October 1998). The infiltration/deposition has been performed, for example, by an alkoxide sol-gel technique and by chemical vapor deposition.

For this latter approach, the quality, e.g., uniformity, of the resultant material clearly relies significantly on the quality of the colloidal sediment. The lattice structure of such sediments generally exhibits two-dimensional periodicity, but not necessarily substantial three-dimensional periodicity. Specifically, sedimentation of the colloidal particles induces a random stacking with the close-packed planes perpendicular to gravity. Such a randomly-stacked structure does not exhibit substantial three-dimensional periodicity, because of the randomness in the gravity direction. It is possible that such materials will be suitable for some applications, e.g., filters and catalysts. However, for many photonic band gap applications, it is desired to have materials exhibiting substantial three-dimensional periodicity.

One reported way to provide improved uniformity of colloidal sediments is to use what is referred to as colloidal epitaxy to form the template crystal, as discussed in A. van Blaaderen et al., "Template-directed colloidal crystallization," *Nature*, Vol. 385, 321 (January 1997), the disclosure of which is hereby incorporated by reference. Colloidal epitaxy involves growing a colloidal crystal normal to an underlying pattern, e.g., a series of holes, reflecting a particular face of a three-dimensionally ordered crystal, e.g., the (100) plane of a face-centered cubic (FCC) crystal. The holes are believed to order the first layer of settling colloidal particles in a manner that controls the further sedimentation. The holes are formed by electron beam lithography into a polymer substrate that serves as the pattern.

Colloidal epitaxy thus appears to be a useful process for improving the quality of colloidal crystals. Improvements, however, are continually sought.

SUMMARY OF THE INVENTION

The invention reflects a recognition that the template technique disclosed in van Blaaderen, supra, does not provide the expected level of three-dimensional periodicity. The invention therefore provides a process involving use of an improved template, by which extremely high-quality colloidal crystals are able to be formed.

Specifically, the template of van Blaaderen et al. is formed lithographically, as discussed above. As illustrated in the schematic cross-section of FIG. 1, the holes of van Blaaderen's template 10 thus exhibit a cross-sectional structure having approximately 90° angles between the hole walls 12 and the template surface 14. It has not been previously recognized that some of the colloidal particles settling onto this template tend to sit on the un-etched surface of the template, e.g., see particle 16, rather than falling into the lithographically formed holes. This phenomenon is believed to be due to concentration of electric fields at the sharp corners 18, which inhibits the particles from falling into the true minimum at the bottom of the holes. (Note that the technique of van Blaaderen appears to work well when using a solvent of glycerol and water and when viewing the sediment while wet. No dried crystal is examined in the van Blaaderen article. In fact, it is substantially impossible to attain a dried sediment with a glycerol/water solvent. As shown in Example 3 below, the van Blaaderen technique does not work as well as desired for a dried sediment.)

The invention avoids these problems by using a template 20 that substantially avoids such 90° angles, as illustrated in the schematic cross-section of FIG. 2, such that the colloidal particles 22 are induced to settle into the desired locations. (The details of the template structure are discussed below.) The colloidal particles thereby settle in an ordered manner, making it possible to form colloidal crystals having substantial three-dimensional order.

In particular, a colloidal template of the invention (designed in this case for square geometry) is characterized by the following: for a drop (about 50 μL) of an aqueous solution containing 4 wt. % colloidal silica spheres placed onto the template and allowed to dry, the resulting structure will show one or more layers of the spheres in a close-packed square geometry in registry with the underlying template (possibly with some vacancies present), with the alignment and spacing of the square lattice maintained across the template surface. (The presence of vacancies in this geometry is possible due to the small amount of solution, but does not negatively reflect on the quality of the template.) See, e.g., Examples 1 and 2, and FIG. 4. This high level of order allows formation of similarly-ordered subsequent layers, leading to a colloidal crystal having substantial three-dimensional order.

In one embodiment, the colloidal template of the invention is formed by a holographic method. Specifically, this embodiment involves spinning a photoresist onto a substrate, exposing the photoresist with crossed laser beams to generate a 1-D grating, rotating the substrate 90°, and exposing the photoresist again with crossed laser beams to generate a 2-D square grating. The photoresist is then developed to generate the desired surface relief pattern, a polymeric mold is made from the photoresist pattern, and the pattern is then cast in a curable optical adhesive. Other techniques for attaining the desired template characteristics are also possible.

DETAILED DESCRIPTION OF THE INVENTION

The process of the invention involves fabrication of an article, including formation of a colloidal crystal using a unique template. Techniques for forming articles from such colloidal crystals are discussed, for example, in U.S. patent application Ser. No. 09/248,858 abandoned May 16, 2001, Ser. No. 09/248,577 allowed Nov. 22, 2000, and Ser. No. 09/312,165, abandoned May 9, 2001 (our references, Braun 1, Braun 2, and Braun 3, respectively), the disclosures of which are hereby incorporated by reference.

Colloidal crystals are periodic structures typically formed from small particles suspended in solution. Conventionally, they are typically formed by allowing slow sedimentation of substantially uniformly-sized particles in a liquid, such that the particles arrange themselves in a periodic manner. A variety of particle sizes are possible, depending on the desired structure and use of the final product. It is possible to form colloidal crystals from a variety of materials. Examples include polystyrene, poly(methyl methacrylate), and silica.

The lattice structure of conventional colloidal sediments generally exhibits two-dimensional periodicity, but not necessarily substantial three-dimensional periodicity. Specifically, sedimentation of the colloidal particles induces a random stacking with the close-packed planes perpendicular to gravity. Such a randomly-stacked structure does not exhibit substantial three-dimensional periodicity, because of the randomness in the gravity direction. However, for many applications, including photonic bandgap uses, it is desired to have materials exhibiting substantial three-dimensional periodicity. One reported prior art way to do so is to use colloidal epitaxy to form the template crystal, as discussed in A. van Blaaderen et al., "Template-directed colloidal crystallization," supra. (As used herein, "colloidal epitaxy" refers to the method disclosed in the A. van Blaaderen et al. article.) Colloidal epitaxy involves growing a colloidal crystal normal to an underlying pattern, e.g., a series of holes, reflecting a particular three-dimensionally ordered crystal, e.g., the (100) plane of a face-centered cubic (FCC) crystal. According to the reference, the holes order the first layer of settling colloidal particles in a manner that controls the further sedimentation.

Figure 1:
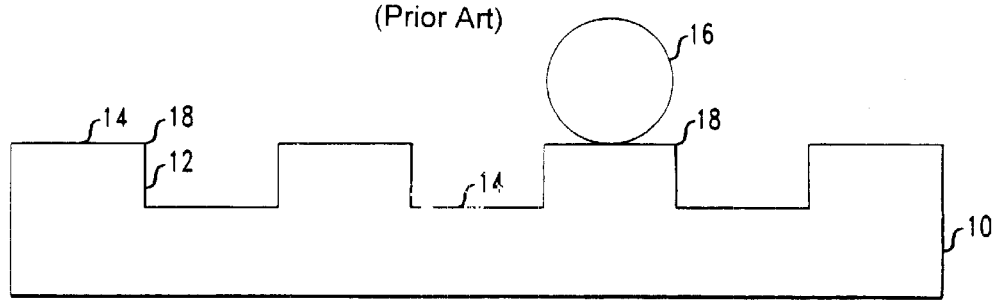
FIG. 1 illustrates a schematic cross-section of a prior art template for forming colloidal crystals.

However, it has been discovered that the colloidal epitaxy of this reference does not always provide the desired results. Specifically, as discussed above, the lithographically-formed holes of van Blaaderen's template exhibit a cross-sectional structure having approximately 90° angles between the hole walls and the template surface. Some of the colloidal particles settling onto this template tend to remain on the surface of the template rather than falling into the holes. This phenomenon is believed to be due to the concentration of electric fields at the sharp corners (corners 18 of FIG. 1), which inhibit the particles from falling into the true minimum at the bottom of the holes. (Note that the technique of van Blaaderen appears to work well when using a solvent of glycerol and water and when viewing the sediment while wet. No dried crystal is examined in the van Blaaderen article. In fact, it is substantially impossible to attain a dried sediment with a glycerol/water solvent. As shown in Example 3 below, the van Blaaderen technique does not work as well as desired for a dried sediment.)

The process of the invention avoids these problems, providing a template that promotes formation of a colloidal sediment having substantial three-dimensional periodicity.

Figure 2:
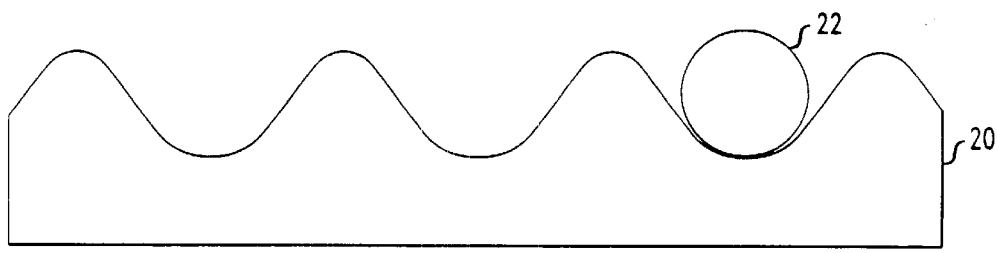
FIG. 2 illustrates a schematic cross-section of a colloidal template according to the invention.
Figure 4:
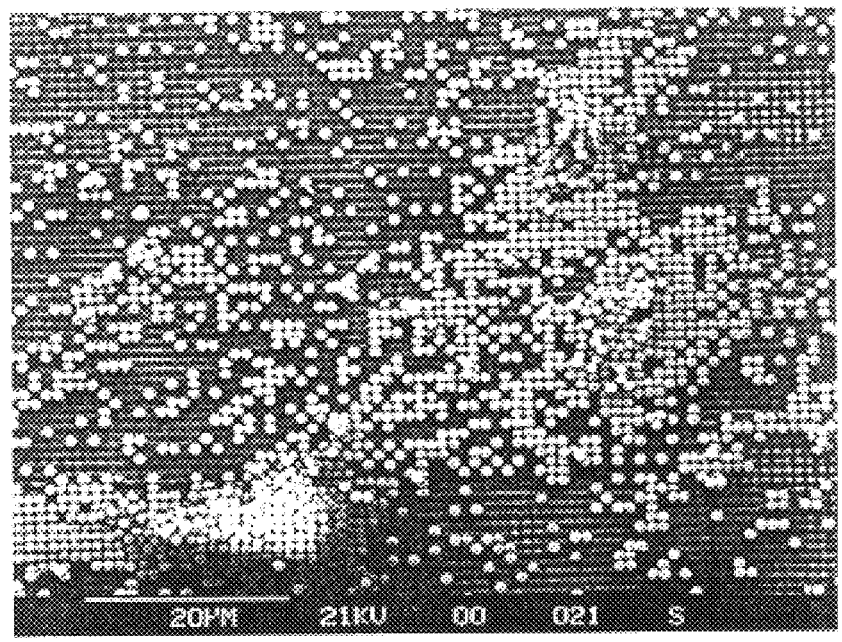
FIG. 4 illustrates the settling of particles onto a colloidal template of the invention.

While various techniques are possible to form the colloidal templates of the invention, the primary concern is the characteristics of the resulting template. In FIG. 2, a colloidal template, according to the invention, is defined as a template having the ability to meet the following test: A drop (about 50 μL) of an aqueous solution containing 4 wt. % colloidal silica spheres is placed onto the template and allowed to dry. (The spheres are of a diameter d, typically ranging in size from 0.2 to 40 μm, generally with a polydispersity of about 5% or less, and the template is designed to accommodate the particular diameter.) The resulting dried structure, typically observed by scanning electron microscope, will show one or more layers of the spheres in a close-packed square geometry (possibly with some vacancies present), in registry with the underlying template. (It is important to observe the dried sample to accurately measure the quality of the template, since the presence of the solvent has the potential to skew the perceived quality of the process.) Moreover, the alignment and spacing of the square lattice will be maintained across the template surface. (The presence of vacancies in this geometry is possible due to the small amount of solution, but does not negatively reflect on the quality of the template.) See, e.g., FIG. 4.

In one embodiment, which meets this functional definition, a colloidal template, designed for a colloidal particles having average diameter, d (typically d is from 0.2 to 40 μm, and the particles have a polydispersity of about 5% or less), is formed according to the following principles. (Each of these principles, independently or in any combination, also tends to contribute to a desirable colloidal template.)

1. The surface of the template has a period, p, as one moves across the template in two perpendicular directions –x and y. The period is the same for x and y, i.e., $p_x = p_y$.
2. The period is generally in the range $d \leq p < 1.1d$, with the upper endpoint being a practical limit that tends to provide desired results. The particular period value is selected, typically by use of some control experiments, to improve the effectiveness of the colloidal template for the particular system.
3. The magnitude of the height, h, in a z direction orthogonal to the plane of the template, i.e., the x-y plane, is generally selected to improve the effectiveness of the colloidal template for the particular system. The height is measured from the center of a well to the center of the adjacent peak. Generally, the mean height, h, is in the range $0.05d < h < 0.3d$, with these end points being practical geometric limits, e.g., below this range, it is possible that particles will not properly settle, and above this range, it is possible that close packing will become difficult.
4. The height of the template surface typically varies smoothly with respect to x and y, i.e., the first and second derivatives of height, h, with respect to x and y are finite at all points on the surface.

An example of a surface that meets these criteria is:

$$z = h/4 * (\sin(2\pi x/p) + \sin(2\pi y/p)).$$

These are only guidelines to formation of suitable templates. Other designs, not falling strictly within each of these guidelines but optionally meeting one or more of them, are also possible.

Figure 3A:
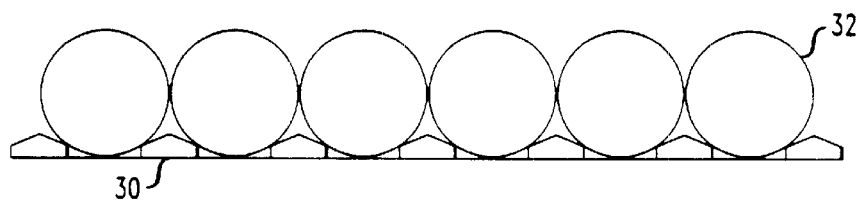
FIGS. 3A and 3B illustrate schematic cross-sections of other colloidal templates according to the invention.
Figure 3B:
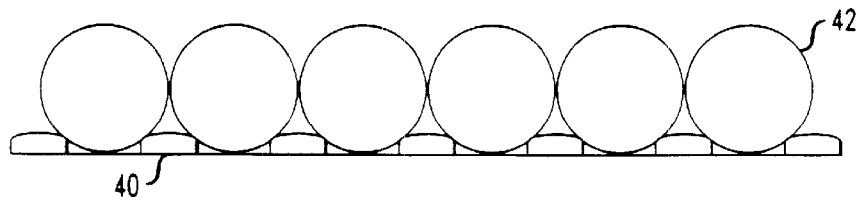

For example, the template designs (30 and 40) of FIGS. 3A and 3B do not meet guideline (4) above, but nonetheless would be expected to provide useful results for colloidal particles (32 and 42) according to the invention.

It is possible to form the colloidal templates of the invention by various techniques. In one embodiment, the colloidal template of the invention is formed by a holographic method, in combination with micro-molding. For example, one manner of using this combination involves spinning a photoresist onto a substrate, exposing the photoresist with crossed laser beams to generate a 1-D grating, rotating the substrate 90°, and exposing the photoresist again with crossed laser beams to generate a 2-D square grating. The photoresist is then developed to generate the desired surface relief pattern, a polymeric mold is made from the photoresist pattern, and the pattern is then cast in a curable optical adhesive. Considerations for the resist material include sensitivity, resolution, and linear response at the wavelength of light being used. Considerations for the molding material include resolution and resistance to the settling solvent.

Other techniques for using holography are also possible, e.g., direct holographic formation of a template, instead of such a holographic/micromolding combination.

Additional techniques suitable for forming the colloidal templates of the invention include a direct lithographic technique followed by a wet etch. For examples, it is possible to form a lithographically defined template in silicon having relatively sharp corners, and then etching the template with HF to round the corners, such that the template meets the guidelines of the invention. In this way, it is possible to use lithographic techniques to form the desired shape, e.g. relatively round peaks, instead of the sharp corners reflected in van Blaaderen.

It is also possible to use the invention to form, instead of a three-dimensional close-packed square geometry, a two-dimensional hexagonal geometry, depending on the particular geometry of the template. For PBG applications, three-dimensional periodicity is generally desired, however.

Once a colloidal template of the invention is formed, a colloidal crystal is formed by suitable techniques. Specifically, colloidal particles in solution are settled onto the template, to form the desired structure. (As used herein, "settled" broadly includes settlement that occurs with or without external promotion. For example, it is possible to allow gravity to induce settlement, to use magnetic fields, e.g., for particles containing magnetic material, to use flow patterns, e.g., by use of a patterned membrane through which the solution flows, to use a vacuum, or to use other external promotion).

A variety of solvents are possible, as long as the desired settlement and drying are attainable. Advantageously, the solvent includes hydrazine hydrate (formed by adding hydrazine and water), or water (e.g., using a sol-gel process such as described in Example 2. See, for example, U.S. Pat. No. 5,240,488, the disclosure of which is hereby incorporated by reference).

A variety of colloidal particles are possible, as long as the desired properties are attained in the resulting colloidal crystal. Suitable particles include silica, polystyrene, and poly(methyl methacrylate), as well as complex particles, e.g., particles made up of more than one material, including particles having distinct cores and shells.

Advantageously, the resulting colloidal crystal, when dried, is a perfect three-dimensional close-packed colloidal crystal. A perfect, 3-D close packed colloidal crystal is characterized by the following test. The crystal, after drying, is imbibed with a fluid having a close, but not identical, refractive index, such as dimethylformamide in a silica colloidal crystal. When illuminated obliquely, the crystal will exhibit iridescence. In a non-perfect sample, polycrystalline domains will be readily apparent during rotation of the crystal—as a mosaic texture on a surface. In a perfect crystal according to the invention, however, a single domain will be exhibited during rotation.

As discussed above, it is possible to form a variety of articles by introducing a material into the voids of a colloidal crystal (and then optionally removing the crystal material). Specifically, ordered structures formed in such a manner are useful for a variety of photonic applications, including optical filters, optical switches, waveguides, routers, laser cavities and other photonic band gap applications. Particular design considerations for PBG materials are known in the art, as reflected for example in J. D. Joannopoulos et al., *Photonic Crystals,* Princeton University Press (1995), the disclosure of which is hereby incorporated by reference. Other applications include filters, catalysts, and biocompatible materials.

The invention will be further clarified by the following examples, which are intended to be exemplary.

EXAMPLE 1

A colloidal template of the invention was constructed by the following process. A 4 cm² array of 0.96 micron square windows, separated by 0.64 microns, were defined with photoresist on a silicon wafer coated with approximately 400 nm of silicon dioxide. The windows were etched to a depth of 200 nm by reactive ion etching with $CHF_3$. The photoresist layer was removed, and the structure was then etched for 5 minutes in 4 wt. % aqueous HF.

A glass tube measuring 1 cm in diameter and 1.5 cm in height was glued to the center of the template with poly(dimethylsiloxane) adhesive. This tube was filled with 650 $\mu$L of a solution comprising 62.86% hydrazine, 36.45% water (the combination of hydrazine and water forming hydrazine hydrate), 0.53% 1.6 micron silica spheres, 0.13% poly(vinyl alcohol) of MW 100,000, and 0.03% LiCl, by weight. (The poly(vinyl alcohol) acts as a binder. LiCl screens electrostatic interactions to allow close packing of particles.) The assembly was placed on a level surface, and the silica spheres were allowed to settle for approximately 2 hours, at which time the solution was removed under reduced pressure. The result was a dried colloidal crystal of 1.6 micron silica spheres.

EXAMPLE 2

A colloidal template of the invention was constructed by the following process. An 18 mm diameter round glass microscope cover slip was coated with Shipley 1805 photoresist, which was then exposed with crossed beams from a 488 nm laser, incident at 14.1° from the surface normal. The sample was rotated 90° in the plane, and then exposed again. The photoresist was developed to yield a two-dimensional surface relief pattern with a period of 1.0 $\mu$m. A mold of this pattern was made in poly(dimethylsiloxane), and the mold was used to cast a replica in UV-cured optical adhesive on a second 18 mm cover slip.

A glass tube measuring 1 cm in diameter and 1.5 cm in height was glued to the center of the template with poly(dimethylsiloxane) adhesive. The tube was filled with 500 mL of a solution comprising 100 $\mu$L of a 4 wt. % solution of 0.99 micron silica spheres in water, 20 $\mu$L of 0.137 M aqueous LiCl, 15 $\mu$L tetramethylammonium hydroxide, and 4 $\mu$L of tetramethylammonium silicate, 15–20% by weight, the balance of the solution being water. (LiCl screens electrostatic interactions to allow close packing of particles. Tetramethylammonium hydroxide stabilizes the particles, preventing agglomeration. Tetramethylammonium silicate provides additional soluble silicate to strengthen the gel body after addition of the methyl formate.) The assembly was placed on a level surface, and the silica spheres were allowed to settle for approximately 12 hours, at which time a 25 $\mu$L quantity of methyl formate was added to induce gelation. After two hours, the supernatant was removed by pipette, and the precipitate was rinsed with a stream of ethanol. The result was a dried colloidal crystal of 0.99 micron silica spheres. The gelation process provides a relatively strong structure that facilitates drying, without cracking.

EXAMPLE 3

A drop (about 50 $\mu$L) of an aqueous solution containing 4 wt. % 0.99 $\mu$m colloidal silica spheres was placed onto the template of Example 2, and allowed to air dry. The resulting structure was coated with about 100 Å of gold in preparation for scanning electron microscopy. The structure is presented in FIG. 4, and shows a close-packed square geometry.

Comparative Example 1

A template was constructed by the following conventional lithographic process, which provided a template of the type disclosed by van Blaaderen et al. A 1 cm² array of 0.6 micron square windows, separated by 0.4 microns, giving an overall pitch of 1 micron, were defined with photoresist on a silicon wafer coated with approximately 400 nm of silicon dioxide. The windows were etched to a depth of 200 nm by reactive ion etching with $CHF_3$, after which the photoresist layer was removed.

A glass tube measuring 1 cm in diameter and 1.5 cm in height was glued to the center of the template with poly(dimethylsiloxane) adhesive. This tube was filled with 650 $\mu$L of a solution comprising 62.86% hydrazine, 36.45% water, 0.53% 1.0 micron silica spheres, 0.13% poly(vinyl alcohol), 100,000 molecular weight, and 0.03% LiCl, by weight. The assembly was placed on a level surface, and the silica spheres were allowed to settle for approximately 2 hours, at which time the solution was removed under reduced pressure. The structure showed substantial disorder, i.e., many, if not most, particles did not settle into the holes. The template thus would not qualify as a colloidal template of the invention.

Comparative Example 2

Figure 5:
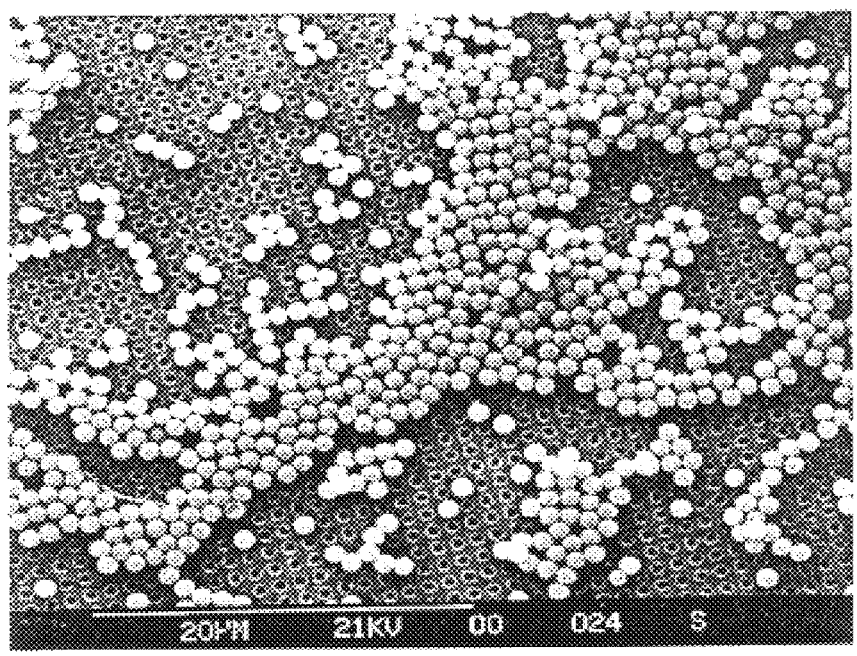
FIG. 5 illustrates the undesirable arrangement of particles on a prior art template.

A drop (about 50 $\mu$L) of an aqueous solution containing 4 wt. % 0.99 $\mu$m colloidal silica spheres was placed onto the template of Comparative Example 1, and allowed to air dry. The resulting structure was coated with about 100 Å of gold in preparation for scanning electron microscopy. The structure is presented in FIG. 5, and shows substantial disorder.

Other embodiments of the invention will be apparent to those skilled in the art from consideration of the specification and practice of the invention disclosed herein.

What is claimed is:

1. A process for fabricating an article, comprising the steps of:

providing a colloidal template, the colloidal template able to provide, after placing onto the template a drop of an aqueous solution containing 4 wt. % colloidal silica spheres and allowing the solution to dry, one or more layers of the spheres in a close-packed square geometry in registry with the underlying template, with the alignment and spacing of the square lattice maintained across the template surface, and settling colloidal particles in solution onto the template.

2. The process of claim 1, wherein the template exhibits a period in two orthogonal directions, the period being equal in the two orthogonal directions.

3. The process of claim 2, wherein the period is in the range $d \leq p < 1.1d$, where d is the average diameter of the colloidal particles.

4. The process of claim 1, wherein at least the first layer of particles settled onto the template exhibit a close-packed square geometry in registry with the template such that the alignment and spacing of the square geometry is maintained across the entire template surface, without regard to the presence of vacancies.

5. The process of claim 1, wherein the template is formed using at least one technique selected from the group consisting of holography, micro-molding, and lithography.

6. The process of claim 1, wherein the diameter of the particles ranges from 0.2 to 40 $\mu$m, with a polydispersity of about 5% or less.

7. The process of claim 1, wherein the particles are selected from silica, polystyrene, poly(methyl methacrylate), and complex particles.

8. A process for fabricating an article, comprising the steps of providing a colloidal template, and settling colloidal particles in solution onto the template, wherein the template exhibits a mean height, h, in a direction orthogonal to the plane of the template, h falling in the range 0.05d<h<0.3d, where d is the average diameter of the colloidal particles.

9. A process for fabricating an article, comprising the steps of providing a colloidal template, and settling colloidal particles in solution onto the template, wherein the template is formed using holography and micro-molding or using lithography and a subsequent wet etch.

10. A process for fabricating an article, comprising the steps of providing a colloidal template, and settling colloidal particles in solution onto the template, further comprising the steps of:

drying the settled particles to form a colloidal crystal;

introducing a material into the voids of the colloidal crystal; and removing the colloidal crystal material.

11. The process of claim 10, wherein the colloidal crystal is a perfect, three-dimensional close-packed colloidal crystal.

12. The process of claim 10, wherein the resultant article exhibits micron-scale periodicities.

13. A process for fabricating an article, comprising the steps of providing a colloidal template, and settling colloidal particles in solution onto the template, wherein the solution comprises hydrazine hydrate.

14. A process for fabricating an article, comprising the steps of providing a colloidal template, and settling colloidal particles in solution onto the template, wherein the solution comprises water, and further comprising the step of inducing gelation in the solution subsequent to the settling.

* * * * *